US012680160B2

(12) United States Patent
Hanashima et al.

(10) Patent No.: US 12,680,160 B2
(45) Date of Patent: Jul. 14, 2026

(54) NOZZLE CLEANING METHOD, SUBSTRATE PROCESSING METHOD, METHOD OF MANUFACTURING SEMICONDUCTOR DEVICE, SUBSTRATE PROCESSING APPARATUS AND NON-TRANSITORY COMPUTER-READABLE RECORDING MEDIUM

(71) Applicant: Kokusai Electric Corporation, Tokyo (JP)

(72) Inventors: Takeo Hanashima, Toyama (JP); Kazuhiro Harada, Toyama (JP); Takuro Ushida, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 17/697,628

(22) Filed: Mar. 17, 2022

(65) Prior Publication Data

US 2022/0298628 A1     Sep. 22, 2022

(30) Foreign Application Priority Data

Mar. 19, 2021     (JP) ................................. 2021-046573

(51) Int. Cl.
*C23C 16/44*          (2006.01)
*C23C 16/455*        (2006.01)

(52) U.S. Cl.
CPC .... *C23C 16/4405* (2013.01); *C23C 16/45563* (2013.01)

(58) Field of Classification Search
CPC ...................... C23C 16/4405; C23C 16/45563
See application file for complete search history.

(56) References Cited

U.S. PATENT DOCUMENTS

2011/0318937 A1 * 12/2011 Akae ................... H01L 21/0228
                                                                                    118/724
2013/0260566 A1    10/2013 Yamazaki
2014/0220788 A1     8/2014 Sano et al.
                                (Continued)

FOREIGN PATENT DOCUMENTS

JP          2008-283148 A     11/2008
JP            2013145788 A      7/2013
                                (Continued)

OTHER PUBLICATIONS

Notice of Reasons for Refusal with English translation in Japanese Application No. 2021-046573, issued Oct. 5, 2022, 12 pages.
                                (Continued)

*Primary Examiner* — Sharidan Carrillo

(74) *Attorney, Agent, or Firm* — Edell, Shapiro & Finnan, LLC

(57) ABSTRACT

There is provided a technique capable of effectively removing a residual element after a cleaning process. According to one aspect of the technique, there is provided a method of manufacturing a semiconductor device, including: (a) supplying a cleaning gas to at least one nozzle among a plurality of nozzles provided in a reaction tube after a substrate is processed in the reaction tube and unloaded out of the reaction tube; and (b) supplying a gas containing hydrogen and oxygen to the at least one nozzle after (a).

16 Claims, 8 Drawing Sheets

(56)                References Cited

U.S. PATENT DOCUMENTS

| | | | |
|---|---|---|---|
| 2015/0031216 A1 | 1/2015 | Akae et al. | |
| 2016/0244875 A1 | 8/2016 | Sasajima et al. | |
| 2016/0362784 A1 | 12/2016 | Isobe et al. | |
| 2017/0260626 A1 | 9/2017 | Nagato et al. | |
| 2019/0368036 A1 | 12/2019 | Kuribayashi et al. | |
| 2021/0040609 A1 | 2/2021 | Harada et al. | |
| 2021/0087678 A1* | 3/2021 | Ebata | C23C 16/4405 |
| 2022/0139693 A1* | 5/2022 | Harada | H01L 21/67248 |
| | | | 438/761 |
| 2022/0262630 A1* | 8/2022 | Nishiura | C23C 16/45546 |
| 2022/0298628 A1* | 9/2022 | Hanashima | B08B 5/02 |

FOREIGN PATENT DOCUMENTS

| | | |
|---|---|---|
| JP | 2014-154652 A | 8/2014 |
| JP | 2014146828 A | 8/2014 |
| JP | 2015-026660 A | 2/2015 |
| JP | 2016-157871 A | 9/2016 |
| JP | 2017005090 A | 1/2017 |
| JP | 2017-168496 A | 9/2017 |
| JP | 2019-212740 A | 12/2019 |

OTHER PUBLICATIONS

TIPO Office Action with English translation in Taiwan Application No. 110149318, issued Nov. 18, 2022, 26 pages.

IPOS Office Action in Singapore Application No. 102022026725, dated Sep. 18, 2023, 10 pages.

Request for the Submission of an Opinion with English translation in Korean Application No. 10-2022-0032570, dated Nov. 24, 2023, 20 pages.

Official Action in Singapore Application No. 102022026725, dated Jun. 21, 2024, 6 pages.

* cited by examiner

NUMBER OF EXECUTIONS OF PROCESS

NUMBER OF EXECUTIONS OF PROCESS

FIG. 8B

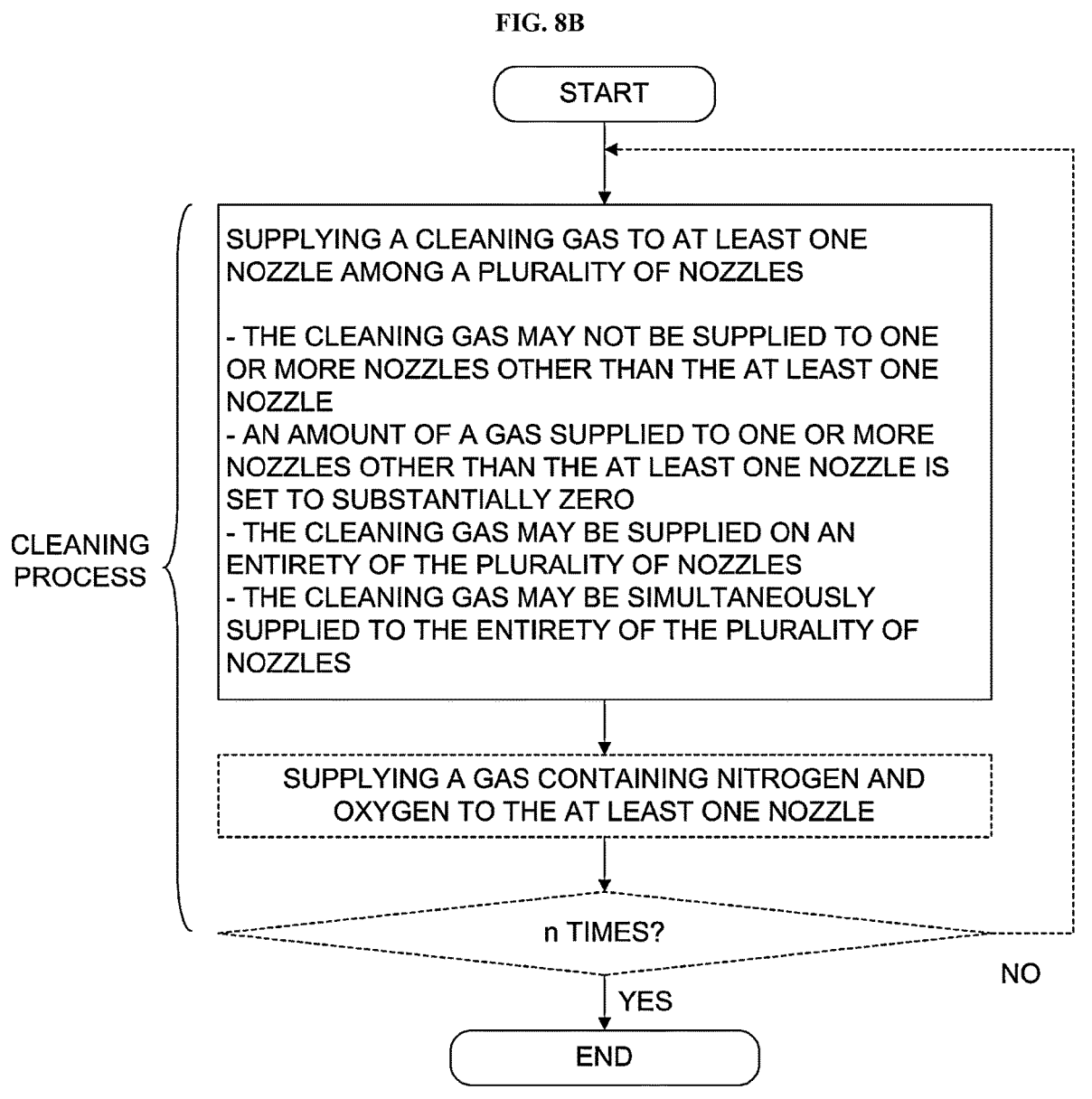

START

CLEANING PROCESS

SUPPLYING A CLEANING GAS TO AT LEAST ONE NOZZLE AMONG A PLURALITY OF NOZZLES

- THE CLEANING GAS MAY NOT BE SUPPLIED TO ONE OR MORE NOZZLES OTHER THAN THE AT LEAST ONE NOZZLE
- AN AMOUNT OF A GAS SUPPLIED TO ONE OR MORE NOZZLES OTHER THAN THE AT LEAST ONE NOZZLE IS SET TO SUBSTANTIALLY ZERO
- THE CLEANING GAS MAY BE SUPPLIED ON AN ENTIRETY OF THE PLURALITY OF NOZZLES
- THE CLEANING GAS MAY BE SIMULTANEOUSLY SUPPLIED TO THE ENTIRETY OF THE PLURALITY OF NOZZLES

SUPPLYING A GAS CONTAINING NITROGEN AND OXYGEN TO THE AT LEAST ONE NOZZLE n TIMES?

NO

YES

END

FIG. 8C

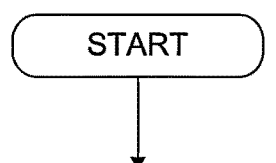

START

FLUORINE
DEACTIVATION
PROCESS

SUPPLYING A GAS CONTAINING HYDROGEN AND
OXYGEN TO THE AT LEAST ONE NOZZLE

- HEATING THE PLURALITY OF NOZZLES SUCH THAT
THE GAS CONTAINING HYDROGEN AND OXYGEN IS
ACTIVATED
     - A TEMPERATURE OF A REACTION REGION IS
SUBSTANTIALLY UNIFORM
     - THE PLURALITY OF NOZZLES ARE HEATED BY A
HEATER ARRANGED AT A LOCATION CORRESPONDING
TO A REGION IN WHICH THE SUBSTRATE IS LOCATED IN
THE REACTION TUBE
     - THE SUBSTRATE INCLUDES A PRODUCT
SUBSTRATE
     - ONE OR BOTH OF THE HEATER AND THE
PLURALITY OF NOZZLES ARE ARRANGED SUCH THAT
AT LEAST A REGION OF EACH OF THE PLURALITY OF
NOZZLES IN WHICH HOLES ARE PROVIDED FACES THE
HEATER
     - THE HEATER IS DIVIDED INTO A PLURALITY OF
ZONES

- CHANGING A TEMPERATURE OF EACH OF THE
PLURALITY OF ZONES SUCH THAT A TEMPERATURE
CONTROL OF EACH OF THE PLURALITY OF ZONES IS
PERFORMED DIFFERENTLY IN THE CLEANING PROCESS
AND THE FLUORINE DEACTIVATION PROCESS
     - A TEMPERATURE OF EACH OF ZONES
CORRESPONDING TO A PROCESS REGION OF THE
SUBSTRATE IS SUBSTANTIALLY THE SAME
     - A TEMPERATURE OF A LOWER END ZONE IS
CONTROLLED TO BE HIGHER THAN THOSE OF THE
OTHER ZONES

- HEATING THE GAS CONTAINING HYDROGEN AND
OXYGEN BY A SECOND HEATER

END

NOZZLE CLEANING METHOD, SUBSTRATE PROCESSING METHOD, METHOD OF MANUFACTURING SEMICONDUCTOR DEVICE, SUBSTRATE PROCESSING APPARATUS AND NON-TRANSITORY COMPUTER-READABLE RECORDING MEDIUM

CROSS REFERENCE TO RELATED APPLICATIONS

This application claims foreign priority under 35 U.S.C. § 119(a)-(d) to Application No. JP 2021-046573 filed on Mar. 19, 2021, the entire contents of which are hereby incorporated by reference.

TECHNICAL FIELD

The present disclosure relates to a nozzle cleaning method, a substrate processing method, a method of manufacturing a semiconductor device, a substrate processing apparatus and a non-transitory computer-readable recording medium.

BACKGROUND

As a part of a manufacturing process of a semiconductor device, a step of processing a substrate in a process vessel of a semiconductor manufacturing apparatus may be performed.

However, when a film-forming process is repeatedly performed in an operation of the semiconductor manufacturing apparatus, a film accumulated in a reaction chamber of the semiconductor manufacturing apparatus may peel off due to a stress. Thereby, a problem such as a generation of particles may occur. Therefore, when a certain amount of the film is accumulated, a cleaning process may be performed to remove the film. In recent years, as the cleaning process, the semiconductor manufacturing apparatus may be operated to perform a gas cleaning process of removing the film accumulated in the reaction chamber by using a reactive gas.

In the cleaning process, for example, a gas containing fluorine (F) such as fluorine ($F_2$) and nitrogen trifluoride ($NF_3$) may be used as a cleaning gas (that is, the reactive gas described above). When the gas is used as the cleaning gas, a residual element such as fluorine contained in the cleaning gas may remain even after the cleaning process is completed, which may hinder the film-forming process. In such a case, a problem may occur that a thickness of the film fluctuates in the film-forming process before and after the cleaning process. In order to address the problem described above, for example, the residual element may be removed by using a treatment of supplying a gas such as ammonia ($NH_3$) gas, or the residual element may be confined by coating the accumulative film in an overlapping manner.

SUMMARY

According to the present disclosure, there is provided a technique capable of effectively removing a residual element after a cleaning process.

According to one aspect of the technique of the present disclosure, there is provided a method of manufacturing a semiconductor device, including: (a) supplying a cleaning gas to at least one nozzle among a plurality of nozzles provided in a reaction tube after a substrate is processed in the reaction tube and unloaded out of the reaction tube; and (b) supplying a gas containing hydrogen and oxygen to the at least one nozzle after (a).

BRIEF DESCRIPTION OF THE DRAWINGS

FIGS. 8A through 8C are diagrams schematically illustrating processes according to the embodiments of the present disclosure.

DETAILED DESCRIPTION

Embodiments

Figure 1:
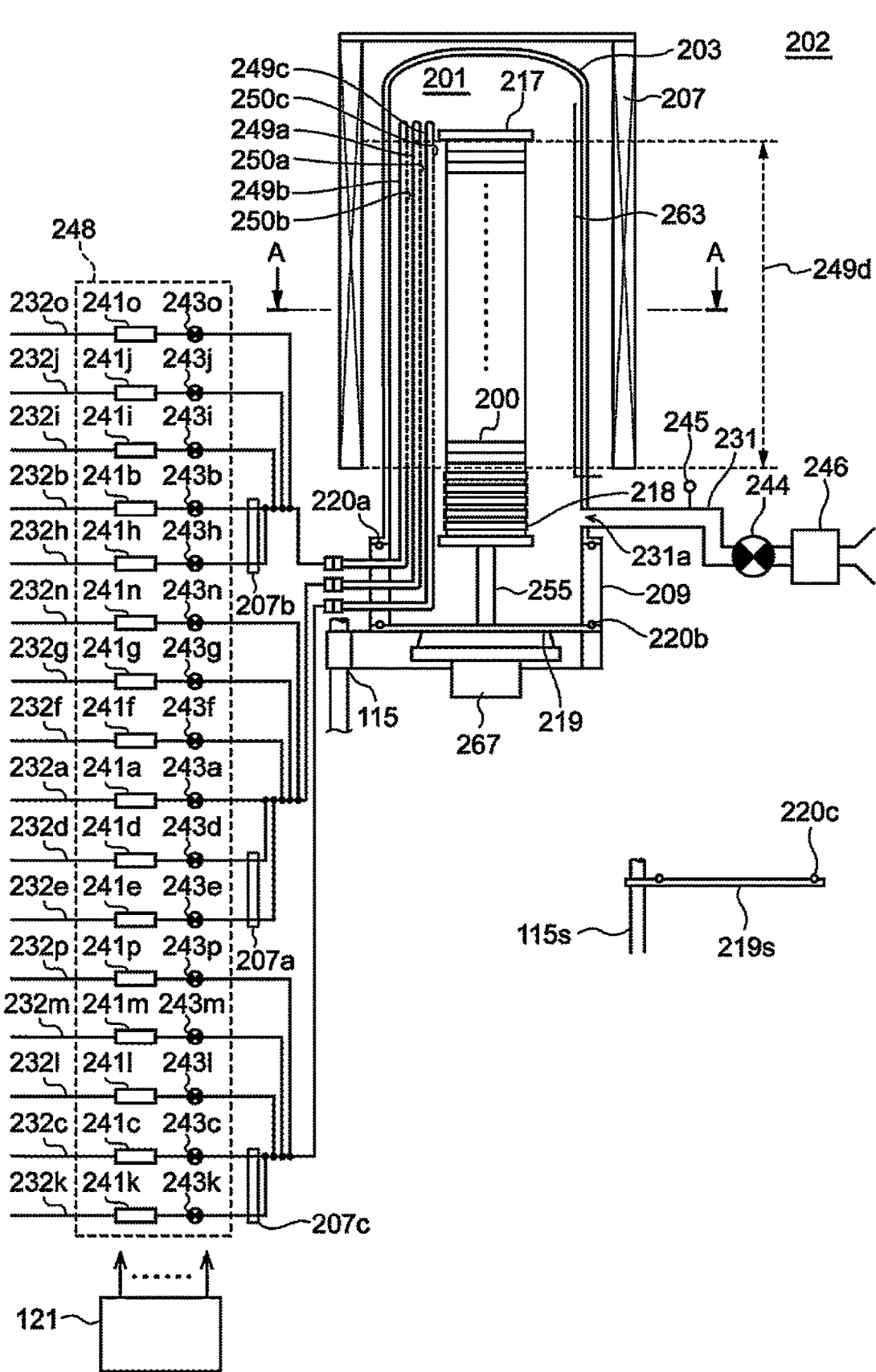
FIG. 1 is a diagram schematically illustrating a vertical cross-section of a vertical type process furnace of a substrate processing apparatus according to one or more embodiments of the present disclosure.

Hereinafter, one or more embodiments (also simply referred to as "embodiments") according to the technique of the present disclosure will be described with reference to the drawings. The drawings used in the following descriptions are all schematic. For example, a relationship between dimensions of each component and a ratio of each component shown in the drawing may not always match the actual ones. Further, even between the drawings, the relationship between the dimensions of each component and the ratio of each component may not always match.

In the present specification, the term "wafer" may refer to "a wafer itself", or may refer to "a wafer and a stacked structure (aggregated structure) of a predetermined layer (or layers) or a film (or films) formed on a surface of a wafer". In the present specification, the term "a surface of a wafer" may refer to "a surface of a wafer itself", or may refer to "a surface of a predetermined layer or a film formed on a wafer". Thus, in the present specification, "forming a predetermined layer (or film) on a wafer" may refer to "forming a predetermined layer (or film) on a surface of a wafer itself", or may refer to "forming a predetermined layer (or film) on a surface of another layer (or another film) formed on a wafer". In the present specification, the terms "substrate" and "wafer" may be used as substantially the same meaning. That is, the term "substrate" may be substituted by "wafer" and vice versa. Further, the wafer (or the substrate) on which the predetermined layer (or the predetermined film) described above is formed may also be referred to as a "semiconductor device".

(1) Configuration of Substrate Processing Apparatus

A substrate processing apparatus according to the present embodiments includes a process furnace 202. As shown in FIG. 1, the process furnace 202 includes a heater 207 serving as a heating apparatus (which is a heating structure or a temperature regulator). The heater 207 is of a cylindrical shape, and is vertically installed while being supported by a support plate (not shown). The heater 207 also functions as an activator (also referred to as an "exciter") capable of activating (exciting) a gas such as a source gas, a first reactive gas and a second reactive gas described later by heat.

A reaction tube 203 is provided in an inner side of the heater 207 to be aligned in a manner concentric with the heater 207. For example, the reaction tube 203 is made of a heat resistant material such as quartz ($SiO2$) and silicon carbide (SiC). The reaction tube 203 is of a cylindrical shape with a closed upper end and an open lower end. A manifold 209 is provided under the reaction tube 203 to be aligned in a manner concentric with the reaction tube 203. For example, the manifold 209 is made of a metal such as stainless steel (SUS). The manifold 209 is of a cylindrical shape with open upper and lower ends. The upper end of the manifold 209 is engaged with the lower end of the reaction tube 203 so as to support the reaction tube 203. An O-ring 220a serving as a seal is provided between the manifold 209 and the reaction tube 203. Similar to the heater 207, the reaction tube 203 is installed vertically. A process vessel (also referred to as a "reaction vessel") is constituted mainly by the reaction tube 203 and the manifold 209. A process chamber 201 is provided in a hollow cylindrical portion of the process vessel. The process chamber 201 is configured to accommodate a plurality of wafers including a wafer 200 serving as a substrate. Hereinafter, the plurality of wafers including the wafer 200 may also be simply referred to as "wafers 200". The wafers 200 are processed in the process chamber 201.

Nozzles 249a, 249b and 249c are provided in the process chamber 201 so as to penetrate a side wall of the manifold 209. The nozzles 249a, 249b and 249c serve as a first supplier (which is a first supply structure), a second supplier (which is a second supply structure) and a third supplier (which is a third supply structure), respectively. The nozzles 249a, 249b and 249c may also be referred to as a first nozzle, a second nozzle and a third nozzle, respectively. For example, each of the nozzles 249a, 249b and 249c is made of a heat resistant non-metal material such as quartz and silicon carbide. Each of the nozzles 249a, 249b and 249c is configured as a shared nozzle through which a plurality of kinds of gas are supplied.

Gas supply pipes 232a, 232b and 232c are connected to the nozzles 249a, 249b and 249c, respectively. The gas supply pipes 232a, 232b and 232c serve as a first pipe, a second pipe and a third pipe, respectively. Each of the gas supply pipes 232a, 232b and 232c is configured as a shared pipe through which the plurality of kinds of gas are supplied. Mass flow controllers (also simply referred to as "MFCs") 241a, 241b and 241c serving as flow rate controllers (flow rate control structures) and valves 243a, 243b and 243c serving as opening/closing valves are sequentially installed at the gas supply pipes 232a, 232b and 232c, respectively, in this order from upstream sides to downstream sides of the gas supply pipes 232a, 232b and 232c in a gas flow direction.

Gas supply pipes 232d, 232e, 232f, 232g and 232n are connected to the gas supply pipe 232a in this order at a downstream side of the valve 243a of the gas supply pipe 232a. MFCs 241d, 241e, 241f, 241g and 241n and valves 243d, 243e, 243f, 243g and 243n are sequentially installed at the gas supply pipes 232d, 232e, 232f, 232g and 232n, respectively, in this order from upstream sides to downstream sides of the gas supply pipes 232d, 232e, 232f, 232g and 232h in the gas flow direction. In addition, a second heater 207a is installed downstream of each of the valves 243d and 243e of the gas supply pipes 232d and 232e.

Gas supply pipes 232h, 232i, 232j and 232o are connected to the gas supply pipe 232b in this order at a downstream side of the valve 243b of the gas supply pipe 232b. MFCs 241h, 241i, 241j and 241o and valves 243h, 243i, 243j and 243o are sequentially installed at the gas supply pipes 232h, 232i, 232j and 232o, respectively, in this order from upstream sides to downstream sides of the gas supply pipes 232h, 232i, 232j and 232o in the gas flow direction. In addition, a second heater 207b is installed downstream of each of the valves 243b and 243h of the gas supply pipes 232b and 232h.

Gas supply pipes 232k, 232l, 232m and 232p are connected to the gas supply pipe 232c in this order at a downstream side of the valve 243c of the gas supply pipe 232c. MFCs 241k, 241l, 241m and 241p and valves 243k, 243l, 243m and 243p are sequentially installed at the gas supply pipes 232k, 232l, 232m and 232p, respectively, in this order from upstream sides to downstream sides of the gas supply pipes 232k, 232l, 232m and 232p in the gas flow direction. In addition, a second heater 207c is installed downstream of each of the valves 243c and 243k of the gas supply pipes 232c and 232k.

For example, each of the gas supply pipes 232a through 232p is made of a metal material. In addition, each of the manifold 209 described above, a seal cap 219, a rotating shaft 255 and an exhaust pipe 231 described later may be made of the same material as that of the gas supply pipes 232a through 232p.

Figure 2:
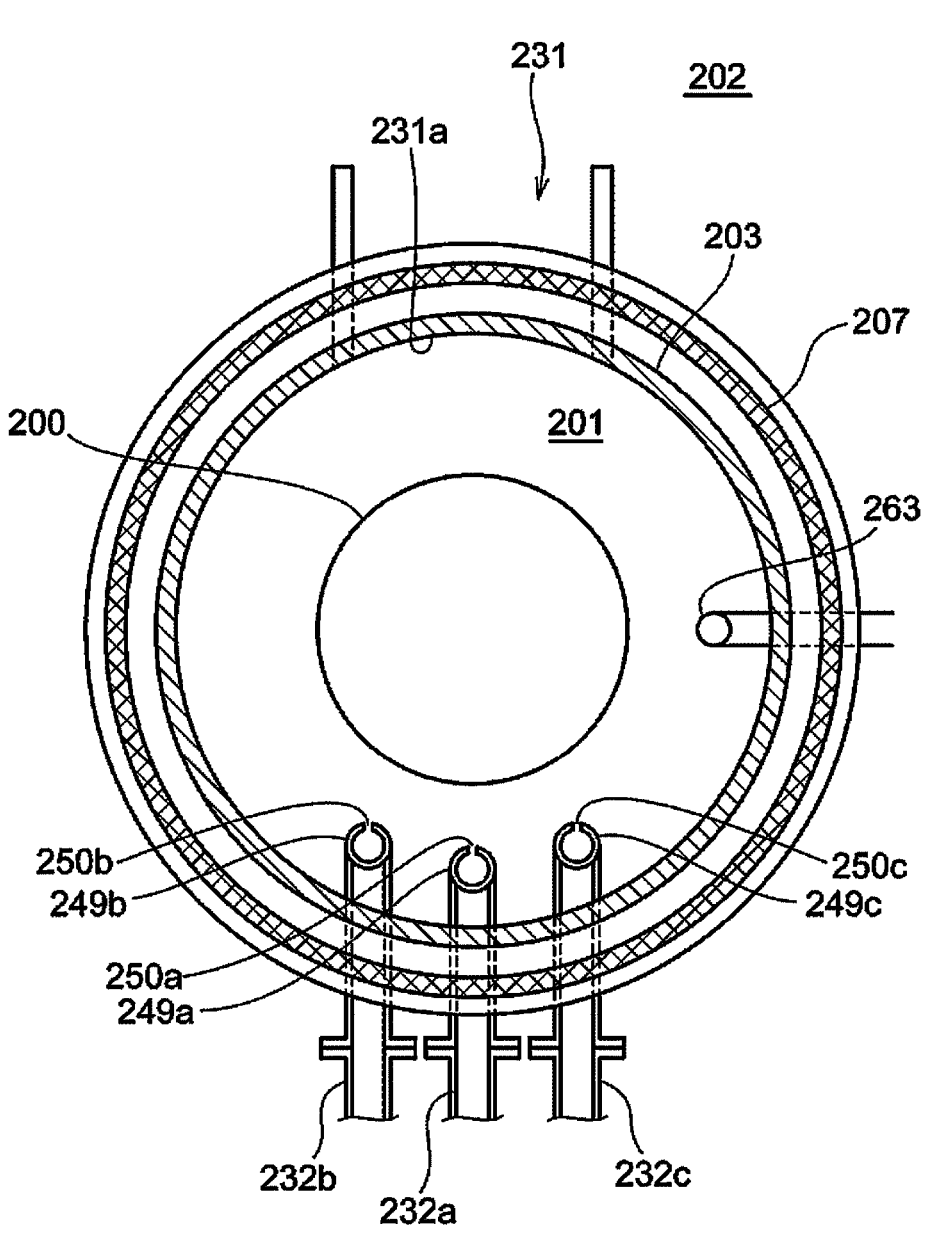
FIG. 2 is a diagram schematically illustrating a horizontal cross-section, taken along the line A-A shown in FIG. 1, of the vertical type process furnace of the substrate processing apparatus according to the embodiments of the present disclosure.

As shown in FIG. 2, each of the nozzles 249a, 249b and 249c is installed in an annular space provided between an inner wall of the reaction tube 203 and the wafers 200 when viewed from above, and extends upward from a lower portion toward an upper portion of the reaction tube 203 along the inner wall of the reaction tube 203 (that is, extends upward along a wafer arrangement direction). That is, each of the nozzles 249a, 249b and 249c is installed in a region that is located beside and horizontally surrounds a wafer arrangement region in which the wafers 200 are arranged (stacked) along the wafer arrangement region. A plurality of gas supply holes 250a, a plurality of gas supply holes 250b and a plurality of gas supply holes 250c are provided at side surfaces of the nozzles 249a, 249b and 249c, respectively. Gases are supplied through the gas supply holes 250a, the gas supply holes 250b and the gas supply holes 250c. The gas supply holes 250a, the gas supply holes 250b and the gas supply holes 250c are open toward centers of wafers 200, respectively, when viewed from above, and are configured such that the gases are supplied toward the wafers 200 through the gas supply holes 250a, the gas supply holes 250b and the gas supply holes 250c. The gas supply holes 250a, the gas supply holes 250b and the gas supply holes 250c are provided from the lower portion toward the upper portion of the reaction tube 203.

The source gas is supplied into the process chamber 201 through the gas supply pipe 232a provided with the MFC 241a and the valve 243a and the nozzle 249a. For example, the term "source gas" may refer to a source material in a gaseous state such as a gas obtained by vaporizing a source material in a liquid state under the normal temperature and the normal pressure and a source material in a gaseous state under the normal temperature and the normal pressure.

The first reactive gas is supplied into the process chamber 201 through the gas supply pipes 232b, 232d and 232k provided with the MFCs 241b, 241d and 241k and the valves 243b, 243d and 243k, respectively, and the nozzles 249b, 249a and 249c.

The second reactive gas is supplied into the process chamber 201 through the gas supply pipes 232c, 232e and 232h provided with the MFCs 241c, 241e and 241h and the valves 243c, 243e and 243h, respectively, and the nozzles 249c, 249a and 249b. The second reactive gas may be a gas whose molecular composition is different from that of the first reactive gas, or whose molecular composition is the same as that of the first reactive gas. In the following description, the present embodiments will be described by way of an example in which the gas whose molecular composition is different from that of the first reactive gas is used as the second reactive gas.

A cleaning gas is supplied into the process chamber 201 through the gas supply pipes 232f, 232i and 232l provided with the MFCs 241f, 241i and 241l and the valves 243f, 243i and 243l, respectively, the gas supply pipes 232a, 232b and 232c and the nozzles 249a, 249b and 249c.

An additive gas is supplied into the process chamber 201 through the gas supply pipes 232g, 232j and 232m provided with the MFCs 241g, 241j and 241m and the valves 243g, 243j and 243m, respectively, the gas supply pipes 232a, 232b and 232c and the nozzles 249a, 249b and 249c.

For example, $N_2$ gas serving as an inert gas is supplied into the process chamber 201 through the gas supply pipes 232n, 232o and 232p provided with the MFCs 241n, 2410 and 241p and the valves 243n, 243o and 243p, respectively, the gas supply pipes 232a, 232b and 232c and the nozzles 249a, 249b and 249c. For example, the $N_2$ gas acts as a purge gas, a carrier gas or a dilution gas.

A source gas supplier (which is a source gas supply structure or a source gas supply system) is constituted mainly by the gas supply pipe 232a, the MFC 241a, the valve 243a and the nozzle 249a. A first reactive gas supplier (which is a first reactive gas supply structure or a first reactive gas supply system) is constituted mainly by the gas supply pipes 232b, 232d and 232k, the MFCs 241b, 241d and 241k, the valves 243b, 243d and 243k and the nozzles 249a, 249b and 249c. A second reactive gas supplier (which is a second reactive gas supply structure or a second reactive gas supply system) is constituted mainly by the gas supply pipes 232c, 232e and 232h, the MFCs 241c, 241e and 241h, the valves 243c, 243e and 243h and the nozzles 249c, 249a, 249b. In addition, the first reactive gas supplier and the second reactive gas supplier may also be collectively or individually referred to as a reactive gas supplier (which is a reactive gas supply structure or a reactive gas supply system). A cleaning gas supplier (which is a cleaning gas supply structure or a cleaning gas supply system) is constituted mainly by the gas supply pipes 232f, 232i and 232l, the MFCs 241f, 241i and 241l and the valves 243f, 243i and 243l. The cleaning gas supplier may further include the gas supply pipes 232a, 232b and 232c and the nozzles 249a, 249b and 249c. An additive gas supplier (which is an additive gas supply structure or an additive gas supply system) is constituted mainly by the gas supply pipes 232g, 232j and 232m, the MFCs 241g, 241j and 241m, the valves 243g, 243j and 241m, the gas supply pipes 232a, 232b and 232c and the nozzles 249a, 249b and 249c. An inert gas supplier (which is an inert gas supply structure or an inert gas supply system) is constituted mainly by the gas supply pipes 232n, 232o and 232p, the MFCs 241n, 2410 and 241p, the valves 243n, 243o and 243p, the gas supply pipes 232a, 232b and 232c and the nozzles 249a, 249b and 249c.

Any one or an entirety of the gas suppliers described above may be embodied as an integrated gas supply system 248 in which the components such as the valves 243a through 243p and the MFCs 241a through 241p are integrated. The integrated gas supply system 248 is connected to the respective gas supply pipes 232a through 232p. An operation of the integrated gas supply system 248 to supply various gases to the gas supply pipes 232a through 232p, for example, operations such as an operation of opening and closing the valves 243a through 243p and an operation of adjusting flow rates of the gases through the MFCs 241a through 241p may be controlled by a controller 121 which will be described later. The integrated gas supply system 248 may be embodied as an integrated structure (integrated unit) of an all-in-one type or a divided type. The integrated gas supply system 248 may be attached to or detached from the components such as the gas supply pipes 232a through 232p on a basis of the integrated structure. Operations such as maintenance, replacement and addition of the integrated gas supply system 248 may be performed on a basis of the integrated structure.

An exhaust port 231a through which an inner atmosphere of the process chamber 201 is exhausted is provided at a lower side wall of the reaction tube 203. The exhaust port 231a may be provided so as to extend upward from the lower portion toward the upper portion of the reaction tube 203 along a side wall of the reaction tube 203 (that is, along the wafer arrangement region). The exhaust pipe 231 is connected to the exhaust port 231a. A vacuum pump 246 serving as a vacuum exhaust apparatus is connected to the exhaust pipe 231 through a pressure sensor 245 and an APC (Automatic Pressure Controller) valve 244. The pressure sensor 245 serves as a pressure detector (pressure detection structure) to detect an inner pressure of the process chamber 201, and the APC valve 244 serves as a pressure regulator (pressure adjusting structure). With the vacuum pump 246 in operation, the APC valve 244 may be opened or closed to vacuum-exhaust the process chamber 201 or stop the vacuum exhaust. With the vacuum pump 246 in operation, the inner pressure of the process chamber 201 may be adjusted by adjusting an opening degree of the APC valve 244 based on pressure information detected by the pressure sensor 245. An exhauster (which is an exhaust structure or an exhaust system) is constituted mainly by the exhaust pipe 231, the APC valve 244 and the pressure sensor 245. The exhauster may further include the vacuum pump 246.

The seal cap 219 serving as a furnace opening lid capable of airtightly sealing (or closing) a lower end opening of the manifold 209 is provided under the manifold 209. The seal cap 219 is made of a metal material such as SUS, and is of a disk shape. An O-ring 220b serving as a seal is provided on an upper surface of the seal cap 219 so as to be in contact with the lower end of the manifold 209. A rotator 267 configured to rotate a boat 217 described later is provided under the seal cap 219. The rotating shaft 255 of the rotator 267 is connected to the boat 217 through the seal cap 219. As the rotator 267 rotates the boat 217, the wafers 200 accommodated in the boat 217 are rotated. The seal cap 219 is elevated or lowered in the vertical direction by a boat elevator 115 serving as an elevator provided outside the reaction tube 203. The boat elevator 115 serves as a transfer device (which is a transfer structure or a transfer system) that loads the boat 217 and the wafers 200 accommodated in the boat 217 into the process chamber 201 or unloads the boat 217 and the wafers 200 accommodated in the boat 217 out of the process chamber 201 by elevating or lowering the seal cap 219. A shutter 219s serving as a furnace opening lid capable of airtightly sealing (or closing) the lower end opening of the manifold 209 is provided under the manifold 209. The shutter 219s is configured to close the lower end opening of the manifold 209 when the seal cap 219 is lowered by the boat elevator 115 and the boat 217 is unloaded out of the process chamber 201. For example, the shutter 219s is made of a metal material such as SUS, and is of a disk shape. An O-ring 220c serving as a seal is provided on an upper surface of the shutter 219s so as to be in contact with the lower end of the manifold 209. An opening and closing operation of the shutter 219s such as an elevation operation and a rotation operation is controlled by a shutter opener/closer (which is a shutter opening/closing structure) 115s.

The boat 217 serving as a substrate retainer is configured such that the wafers 200 (for example, 25 wafers to 200 wafers) are accommodated (or supported) in the vertical direction in the boat 217 while the wafers 200 are horizontally oriented with their centers aligned with one another with a predetermined interval therebetween in a multistage manner. For example, the boat 217 is made of a heat resistant material such as quartz and SiC. For example, a plurality of heat insulation plates 218 made of a heat resistant material such as quartz and SiC are provided below the boat 217 to be supported in a multistage manner.

A temperature sensor 263 serving as a temperature detector is installed in the reaction tube 203. A state of electric conduction to the heater 207 is adjusted based on temperature information detected by the temperature sensor 263 such that a desired temperature distribution of an inner temperature of the process chamber 201 can be obtained. The temperature sensor 263 is provided along the inner wall of the reaction tube 203.

Figure 3:
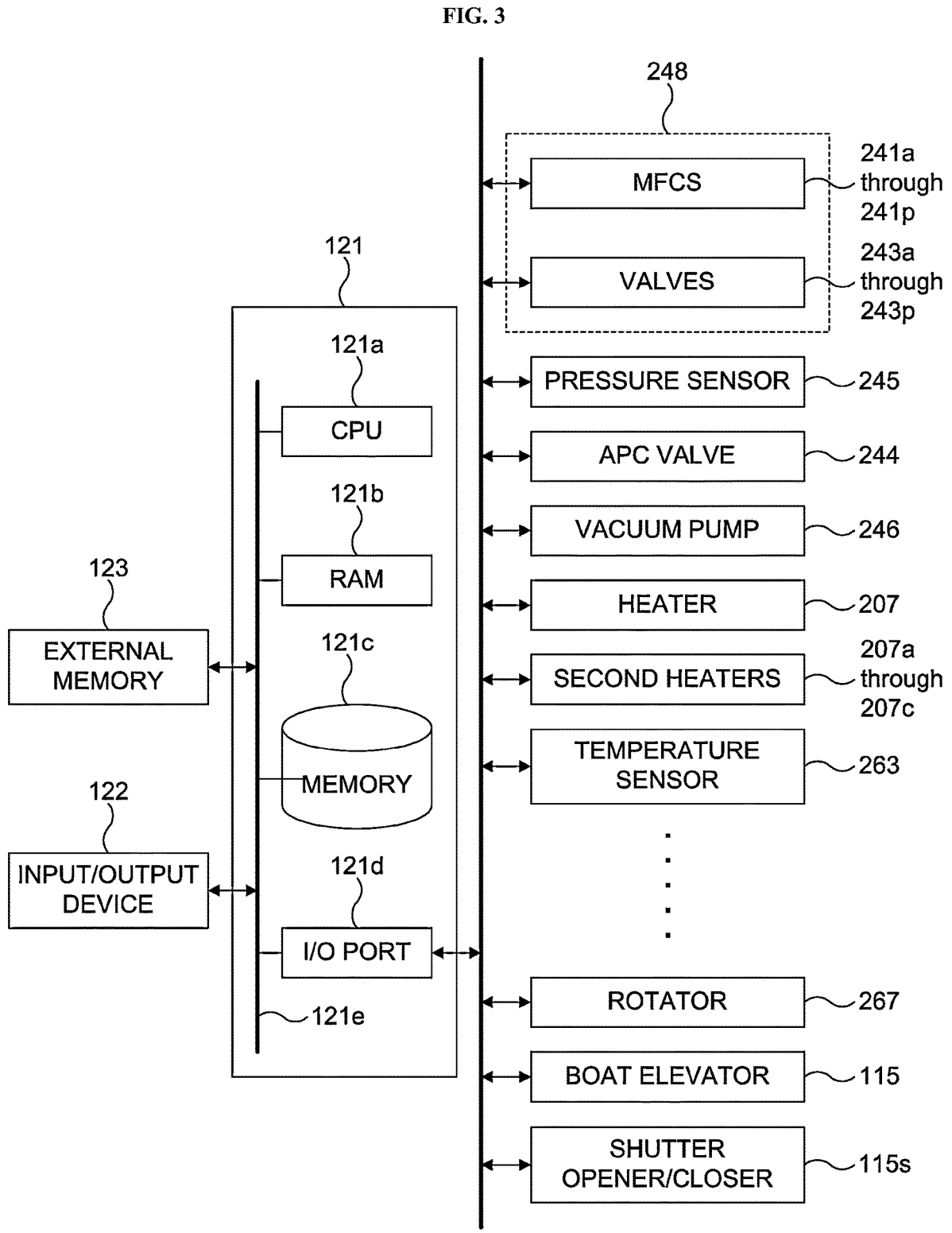
FIG. 3 is a block diagram schematically illustrating a configuration of a controller and related components of the substrate processing apparatus according to the embodiments of the present disclosure.

As shown in FIG. 3, the controller 121 serving as a control device (control structure) is constituted by a computer including a CPU (Central Processing Unit) 121a, a RAM (Random Access Memory) 121b, a memory 121c and an I/O port 121d. The RAM 121b, the memory 121c and the I/O port 121d may exchange data with the CPU 121a through an internal bus 121e. For example, an input/output device 122 constituted by a component such as a touch panel is connected to the controller 121.

The memory 121c is configured by a component such as a flash memory and a hard disk drive (HDD). For example, a control program configured to control the operation of the substrate processing apparatus, a process recipe containing information on sequences and conditions of a film-forming process described later, or a cleaning recipe containing information on sequences and conditions of a cleaning process described later is readably stored in the memory 121c. The process recipe is obtained by combining steps (sequences or processes) of the film-forming process described later such that the controller 121 can execute the steps to acquire a predetermined result, and functions as a program. The cleaning recipe is obtained by combining steps (sequences or processes) of the cleaning process described later such that the controller 121 can execute the steps to acquire a predetermined result, and functions as a program. Hereinafter, the process recipe, the cleaning recipe and the control program may be collectively or individually referred to as a "program". In addition, each of the process recipe and the cleaning recipe may also be simply referred to as a "recipe". Thus, in the present specification, the term "program" may refer to the recipe alone, may refer to the control program alone, or may refer to both of the recipe and the control program. The RAM 121b functions as a memory area (work area) where a program or data read by the CPU 121a is temporarily stored.

The I/O port 121d is connected to the above-described components such as the MFCs 241a through 241p, the valves 243a through 243p, the pressure sensor 245, the APC valve 244, the vacuum pump 246, the temperature sensor 263, the heater 207, the second heaters 207a through 207c, the rotator 267, the boat elevator 115 and the shutter opener/closer 115s.

The CPU 121a is configured to read the control program from the memory 121c and execute the read control program. In addition, the CPU 121a is configured to read the recipe from the memory 121c in accordance with an operation command inputted from the input/output device 122. According to the contents of the read recipe, the CPU 121a may be configured to be capable of controlling various operations such as flow rate adjusting operations for various gases by the MFCs 241a through 241p, opening and closing operations of the valves 243a through 243p, an opening and closing operation of the APC valve 244, a pressure adjusting operation by the APC valve 244 based on the pressure sensor 245, a start and stop of the vacuum pump 246, a temperature adjusting operation by the heater 207 based on the temperature sensor 263, temperature adjusting operations of the second heaters 207a through 207c, an operation of adjusting the rotation and the rotation speed of the boat 217 by the rotator 267, an elevating and lowering operation of the boat 217 by the boat elevator 115 and an opening and closing operation of the shutter 219s by the shutter opener/closer 115s.

The controller 121 serving as the control structure described above is configured to be capable of controlling the transfer structure, the cleaning gas supplier through which the cleaning gas is supplied and the reactive gas supplier through which a gas containing hydrogen and oxygen (that is a reactive gas) so as to perform: (a) supplying the cleaning gas to at least one nozzle among the nozzles 249a, 249b and 249c after the substrate (that is, the wafer 200) is processed in the reaction tube 203 and transferred (unloaded) out of the reaction tube 203; (b) supplying the gas containing hydrogen and oxygen to the at least one nozzle after (a); and (c) transferring (loading) a subsequent substrate (that is, a subsequent wafer 200) into the reaction tube 203 after (b).

The controller 121 may be embodied by installing the above-described program (that is, a program that causes, by a computer, the substrate processing apparatus to perform: (a) supplying the cleaning gas to at least one nozzle of the nozzle 249a, 249b or 249c after the substrate (that is, the wafer 200) is processed in the reaction tube 203 (in which a plurality of nozzles such as the nozzles 249a, 249b and 249c are provided) and transferred (unloaded) out of the reaction tube 203; (b) supplying the gas containing hydrogen and oxygen to the at least one nozzle after (a); and (c) transferring (loading) the subsequent substrate (that is, the subsequent wafer 200) into the reaction tube 203 after (b)) stored in an external memory 123 into the computer. For example, the external memory 123 may include a magnetic disk such as a hard disk drive (HDD), an optical disk such as a CD, a magneto-optical disk such as an MO and a semiconductor memory such as a USB memory. The memory 121c or the external memory 123 may be embodied by a non-transitory computer readable recording medium. Hereafter, the memory 121c and the external memory 123 may be collectively or individually referred to as a "recording medium". In the present specification, the term "recording medium" may refer to the memory 121*c* alone, may refer to the external memory 123 alone, and may refer to both of the memory 121*c* and the external memory 123. Instead of the external memory 123, a communication means such as the Internet and a dedicated line may be used for providing the program to the computer.

(2) Method of Manufacturing Semiconductor Device

Figure 8A:
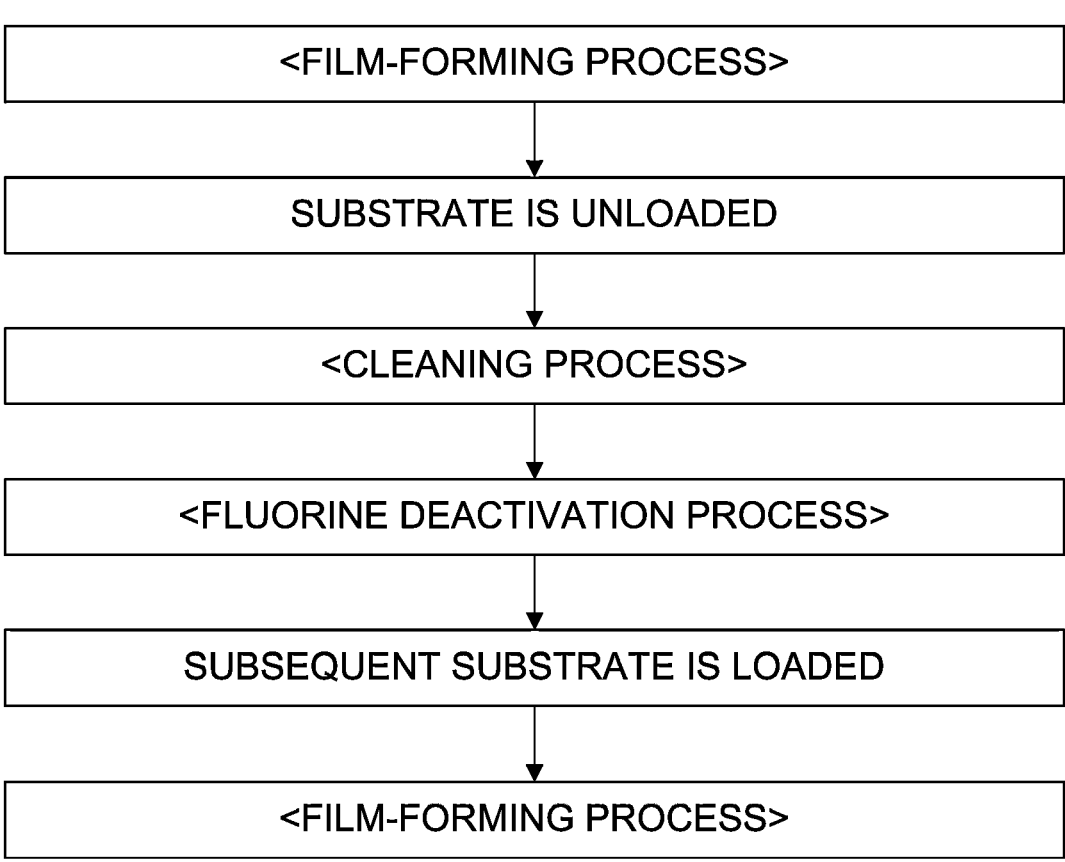

A method of manufacturing a semiconductor device according to the technique of the present disclosure will be described with reference to FIGS. 8A through 8C. The method of manufacturing the semiconductor device according to the technique of the present disclosure by using the substrate processing apparatus described above may include: (a) supplying the cleaning gas to at least one nozzle among the nozzles 249*a*, 249*b* or 249*c* after the substrate (that is, the wafer 200) is processed in the reaction tube 203 (in which the plurality of nozzles such as the nozzles 249*a*, 249*b* and 249*c* are provided) and transferred (unloaded) out of the reaction tube 203; (b) supplying the gas containing hydrogen and oxygen to the at least one nozzle after (a); and (c) transferring (loading) the subsequent substrate (that is, the subsequent wafer 200) into the reaction tube 203 after (b).

According to the present embodiments, the term "plurality of nozzles" in the method of manufacturing the semiconductor device refers to the three nozzles 249*a*, 249*b* and 249*c* of the substrate processing apparatus described above. However, the "plurality of nozzles" are not limited to the three nozzles, and may be two nozzles or four or more nozzles.

(2-1) Processing of Substrate (Wafer 200)

As a processing of the substrate (that is, the wafer 200) in the reaction tube 203 performed before (a) of the method of manufacturing the semiconductor device described above, for example, a substrate processing (also referred to as the "film-forming process") is performed. According to the film-forming process, a film containing a predetermined element is formed on the wafer 200 by performing a cycle a predetermined number of times (n times, n is a natural number equal to or greater than 1). For example, the cycle may include: a first step of supplying the source gas to the wafer 200 in the reaction tube 203 through the gas supply pipe 232*a* and the nozzle 249*a*; a second step of removing the source gas remaining in the process chamber 201 by vacuum-exhausting an inner atmosphere of the reaction tube 203 while supplying the purge gas through the gas supply pipe 232*n* and the nozzle 249*a* after stopping a supply of the source gas into the reaction tube 203; a third step of supplying the first reactive gas to the wafer 200 in the reaction tube 203 through the gas supply pipe 232*b* and the nozzle 249*b* and the second reactive gas to the wafer 200 in the reaction tube 203 through the gas supply pipe 232*c* and the nozzle 249*c*; and a fourth step of removing the first reactive gas and the second reactive gas remaining in the process chamber 201 by vacuum-exhausting the inner atmosphere of the reaction tube 203 while supplying the $N_2$ gas serving as the purge gas through the gas supply pipes 232*o* and 232*p* and the nozzles 249*b* and 249*c* after stopping a supply of the first reactive gas and a supply of the second reactive gas into the reaction tube 203. The first step, the second step, the third step and the fourth step of the cycle are non-simultaneously performed. In addition, an exhaust process in each of the second step and the fourth step is performed through the exhaust port 231*a* via the exhaust pipe 231.

As the source gas, a halosilane-based gas containing silicon (Si) serving as a main element (predetermined element) constituting the film to be formed and a halogen element may be used. For example, "halosilane" refers to silane containing a halogen group. The halogen group refers to a group such as a chloro group, a fluoro group, a bromo group and an iodo group. That is, the halogen group contains a halogen element such as chlorine (CO, fluorine (F), bromine (Br) and iodine (I). As the halosilane-based gas, for example, a source gas containing silicon and chlorine (that is, a chlorosilane-based gas) may be used. The chlorosilane-based gas serves as a silicon source. As the chlorosilane-based gas, for example, hexachlorodisilane ($Si_2Cl_6$, abbreviated as HCDS) gas may be used. The HCDS gas is a gas containing an element such as silicon capable of being solidified by itself under process conditions described later, that is, a gas capable of depositing a film by itself under the process conditions described later.

As the first reactive gas, for example, a hydrogen (H)-containing gas may be used. As the hydrogen-containing gas, for example, hydrogen ($H_2$) gas or a gas containing activated hydrogen may be used.

As the second reactive gas, for example, an oxygen (O)-containing gas may be used. As the oxygen-containing gas, for example, oxygen ($O_2$) gas, water vapor ($H_2O$) gas, ozone ($O_3$) gas or a gas containing activated oxygen may be used.

In the present specification, the film-forming process described above may be represented as follows. In addition, "P/V" may refer to a purge process and the exhaust process (also referred to as a "vent process") in each of the second step and the fourth step.

$$(\text{Source Gas->P/V->First Reactive Gas+Second Reactive Gas->P/V})\times n$$

Other processes in the present specification may also be represented in the same manner.

(2-2) Cleaning Process

The cleaning process in (a) of the method of manufacturing the semiconductor device described above, for example, is performed by supplying the cleaning gas to the reaction tube 203 through at least one nozzle among the nozzles 249*a*, 249*b* and 249*c*. As the cleaning gas, for example, a fluorine (F)-containing gas may be used. As the fluorine-containing gas, for example, fluorine ($F_2$) gas or nitrogen trifluoride ($NF_3$) gas may be used. In the following description, the present embodiments will be described by way of an example in which the $F_2$ gas is used as the cleaning gas.

For example, when the source gas is supplied through the nozzle 249*a*, the cleaning gas may be supplied through the gas supply pipe 232*f* via the nozzle 249*a*. In such a case, it is preferable that the cleaning gas is not supplied to the other nozzles 249*b* and 249*c* during (a) described above. Thereby, when each of the nozzles 249*a*, 249*b* and 249*c* is configured as a nozzle made of quartz, it is possible to prevent (or suppress) the nozzles to which the cleaning gas is not supplied from being etched by the fluorine-containing gas. As a result, it is possible to extend a life time of the nozzles.

On the other hand, during (a) described above, it is preferable that an amount of gas supplied to the other nozzles 249*b* and 249*c* to which the cleaning gas is not supplied is set to substantially zero. Thereby, the cleaning gas supplied through the nozzle 249*a* may enter into the other nozzles 249*b* and 249. As a result, it is possible to perform the cleaning process to the nozzles to which the cleaning gas is not supplied.

On the other hand, (a) described above may be performed by supplying the cleaning gas into the reaction tube 203 through the entirety of the nozzles 249*a*, 249*b* and 249*c*. That is, by supplying the cleaning gas into the reaction tube 203 through each of the gas supply pipes 232*f*, 232*i* and 232*l* and each of the nozzles 249*a*, 249*b* and 249*c*, it is possible to improve a uniformity of the cleaning process in the reaction tube 203. Further, in such a case, the cleaning gas may be supplied into the reaction tube 203 simultaneously through the entirety of the nozzles 249*a*, 249*b* and 249*c*. By supplying the cleaning gas simultaneously through the entirety of the nozzles 249*a*, 249*b* and 249*c* as described above, it is possible to prevent (or suppress) a substance such as a residual fluorine and reaction products (for example, hydrogen fluoride (HF)) generated in (b) described later from entering and remaining in the nozzles to which the cleaning gas is not supplied. For example, as long as there is a timing at which the cleaning gas is supplied into the reaction tube 203 through the entirety of the nozzles 249*a*, 249*b* and 249*c*, a start timing of a supply of the cleaning gas and an end timing of the supply of the cleaning gas in each nozzle may not match. However, from a viewpoint of preventing the substance such as the residual fluorine and the HF from entering the other nozzles (that is, the nozzles to which the cleaning gas is not supplied), it is preferable that the end timing of the supply of the cleaning gas in each nozzle is substantially the same, and it is more preferable that the start timing of the supply of the cleaning gas in each nozzle is also substantially the same.

In addition, among the plurality of nozzles, it is preferable to supply the additive gas to the nozzle to which (a) described above is performed. For example, when the cleaning gas is supplied through the nozzle 249*a*, the additive gas is supplied into the reaction tube 203 through the gas supply pipe 232*g* and the nozzle 249*a*. When the cleaning gas is supplied through the nozzle 249*b*, the additive gas is supplied into the reaction tube 203 through the gas supply pipe 232*j* and the nozzle 249*b*. Further, when the cleaning gas is supplied through the nozzle 249*c*, the additive gas is supplied into the reaction tube 203 through the gas supply pipe 232*m* and the nozzle 249*c*.

As the additive gas, for example, a nitrogen oxide-based gas containing nitrogen (N) and oxygen (O) may be used. The nitrogen oxide-based gas cannot perform a cleaning action by itself. However, the nitrogen oxide-based gas serves to improve the cleaning action of the cleaning gas by generating active species such as fluorine radicals and halogenated nitrosyl compounds when it reacts with the cleaning gas. As the nitrogen oxide-based gas, for example, nitric oxide (NO) gas may be used. By supplying the additive gas as described above, for example, it is possible to generate the fluorine radical (·F) by the cleaning gas and the additive gas. Therefore, it is possible to improve an efficiency of the cleaning process.

In addition, when the additive gas is supplied to the nozzle to which (a) described above is performed, it is preferable that the supply of the cleaning gas and a supply of the additive gas are performed not simultaneously but alternately. As a result, for example, it is possible to suppress a direct reaction between the cleaning gas and the additive gas. In addition, by suppressing an amount of the fluorine radicals (F) from being generated, for example, it is possible to suppress etching of the nozzle made of quartz.

A processing (that is, the cleaning process) of alternately performing the supply of the cleaning gas and the supply of the additive gas may be represented as "process A" or "process B" described below. In addition, as a pattern of the cleaning process, several patterns may be used as described later.

$$(\text{Cleaning Gas->P/V->Additive Gas->P/V})\times n \qquad \text{Process A:}$$

$$(\text{Additive Gas->P/V->Cleaning Gas->P/V})\times n \qquad \text{Process B:}$$

First Pattern of Cleaning Process

The process A or the process B may be performed on one or more nozzles among the plurality of nozzles. Alternatively, the process A or the process B may be performed on each of the plurality of nozzles. By performing the process A or the process B on the one or more nozzles, it is possible to mix a predetermined amount of the cleaning gas and the additive gas in the nozzle, and it is possible to perform the cleaning process in the nozzle. According to the present embodiments, the "predetermined amount of the cleaning gas and the additive gas" refers to an amount at which the cleaning gas (which remains in the nozzle, for example, by being adsorbed in the nozzle) reacts with the additive gas supplied later.

Second Pattern of Cleaning Process

Alternatively, the process A or the process B may be simultaneously performed on each of the plurality of nozzles. By simultaneously performing the process A or the process B on each of the plurality of nozzles, it is possible to uniformize a cleaning speed of the entire nozzles and their surroundings.

Third Pattern of Cleaning Process

Alternatively, the process A is performed on a nozzle among the plurality of nozzles, and the process B is performed on another nozzle among the plurality of nozzles. Specifically, the process A is performed on the nozzle 249*b*, and the process B is performed on the nozzle 249*c*. With such a configuration, it is possible to simultaneously supply the cleaning gas and the additive gas into the reaction tube 203. By simultaneously supplying the cleaning gas and the additive gas, it is possible to improve the efficiency of the cleaning process in the reaction tube 203. Further, by changing supply positions of the cleaning gas and the additive gas in a sequential order, it is possible to suppress the unevenness of the cleaning process in the plurality of nozzles and in the reaction tube 203, and it is also possible to uniformly perform the cleaning process with respect to an inside of the nozzle or an inside of the reaction tube 203.

In addition, in the third pattern of the cleaning process, a "process C" of continuously supplying the inert gas to the nozzle 249*a* may be performed. By continuously supplying the inert gas to the nozzle 249*a*, it is possible to suppress a rapid reaction between the gas supplied through the nozzle 249*b* and the gas supplied through the nozzle 249*c* at portions adjacent to the nozzle 249*b* and the nozzle 249*c* in the reaction tube 203. Further, it is possible that the inert gas supplied through the nozzle 249*a* serves as a guide for the gases supplied through the nozzle 249*b* and the nozzle 249*c*, and that the inert gas supplied through the nozzle 249*a* contributes to uniformly performing the cleaning process with respect to the inside of the reaction tube 203. In addition, the process A or the process B may also be performed on the nozzle 249*a*. Alternatively, one of the process A or the process B and the process C may be performed in this order on the nozzle 249*a*.

In addition, the cleaning process may be performed by combining the process patterns described above.

(2-3) Fluorine Deactivation Process

The fluorine deactivation process in (b) of the method of manufacturing the semiconductor device described above, for example, is performed by supplying the gas containing hydrogen and oxygen to the nozzle through which the cleaning gas is supplied into the reaction tube 203 in (a) described above. According to the present embodiments, the term "gas containing hydrogen and oxygen" preferably refers to a mixed gas obtained by supplying the hydrogen ($H_2$) gas and the oxygen ($O_2$) gas through different gas supply pipes and mixing them at least in the nozzle. However, the term "gas containing hydrogen and oxygen" may refer to a gas containing a hydrogen (H) atom and an oxygen (O) atom in one molecule, such as water vapor ($H_2O$) and hydrogen peroxide ($H_2O_2$). For example, a reaction formula representing a mechanism of removing fluorine ($F_2$) or fluorine ion ($F^-$) remaining in the reaction tube 203 by the mixed gas of the $H_2$ gas and the $O_2$ gas is considered to be as follows.

$$3H_2+O_2+F_2->2HF+2H_2O$$

$$2H_2+O_2+2F^-->2HF+2OH^-$$

Further, it is considered that the following reaction occurs due to the water vapor ($H_2O$) generated by the mixed gas of the $H_2$ gas and the $O_2$ gas.

$$H_2O+F^-->HF+OH^-$$

According to the present embodiments, by supplying the $H_2$ gas serving as the first reactive gas and the $O_2$ gas serving as the second reactive gas through different gas supply pipes and by adjusting flow rates thereof by each MFC, it is possible to perform a fluorine removing process in accordance with a chemical state of fluorine remaining in the nozzle or in the reaction tube 203. For example, a flow rate ratio of each of the first reactive gas and the second reactive gas may be changed in accordance with the state of fluorine remaining in the nozzle or in the reaction tube 203. Further, the flow rate ratio may be adjusted to be changed in accordance with a component from which the residual fluorine is removed. According to the present embodiments, the term "component from which the residual fluorine is removed" may refer to the nozzle or the reaction tube 203. For example, the flow rate ratio may be different between a step of removing the residual fluorine in the nozzle and a step of removing the residual fluorine in the reaction tube 203. Further, the flow rate may be set to be different for each step described above.

For example, when the cleaning gas is supplied through the nozzle 249a, the first reactive gas is supplied through the gas supply pipe 232d and the second reactive gas is supplied through the gas supply pipe 232e, and the mixed gas of the first reactive gas and the second reactive gas is supplied into the reaction tube 203 through the nozzle 249a. Further, when the cleaning gas is supplied through the nozzle 249b, the first reactive gas is supplied through the gas supply pipe 232h, and the mixed gas of the first reactive gas and the second reactive gas is supplied into the reaction tube 203 through the nozzle 249b. Further, when the cleaning gas is supplied through the nozzle 249c, the first reactive gas is supplied through the gas supply pipe 232k and the second reactive gas is supplied through the gas supply pipe 232c, and the mixed gas of the first reactive gas and the second reactive gas is supplied into the reaction tube 203 through the nozzle 249c.

According to the present embodiments, when the cleaning gas is supplied into the reaction tube 203 through the entirety of the nozzles 249a, 249b and 249c in (a) described above, by supplying the mixed gas of the first reactive gas and the second reactive gas into the reaction tube 203 through the entirety of the nozzles 249a, 249b and 249c, it is possible to more reliably perform the fluorine removing process in the reaction tube 203. That is, when the cleaning gas is supplied to any one of the nozzles, the residual fluorine and reaction products may enter the other nozzles (that is, a backflow into the other nozzles may occur). However, by supplying the mixed gas through the entirety of the nozzles 249a, 249b and 249c, it is possible to suppress the backflow into the other nozzles.

Further, in (b) described above, it is preferable to heat the plurality of nozzles 249a, 249b and 249c with the heater 207 configured to heat the reaction tube 203 such that the gas containing hydrogen and oxygen is activated in the nozzles 249a, 249b and 249c. By heating and reacting the $H_2$ gas and the $O_2$ gas as described above, in addition to the water vapor ($H_2O$), it is possible to generate a plurality of kinds of active species such as a hydroxyl group active species (.OH), an oxygen active species (O) and a hydrogen active species (.H). Therefore, even when the residual fluorine in the reaction tube 203 is present in a plurality of chemical states, it is possible to deactivate the residual fluorine in the nozzles 249a, 249b and 249c (to which the fluorine-containing gas is supplied) by the plurality of kinds of active species. As a result, it is possible to remove fluorine.

For example, when the plurality of nozzles 249a, 249b and 249c are heated by the heater 207 configured to heat the reaction tube 203 as described above, the plurality of nozzles 249a, 249b and 249c are heated such that a temperature of a reaction region (also referred to as a "main region") of each of the plurality of nozzles 249a, 249b and 249c is substantially uniform. Preferably, the plurality of nozzles 249a, 249b and 249c are heated such that the reaction of the first reactive gas and the second reactive gas described above can occur in the reaction region of each of the plurality of nozzles 249a, 249b and 249c. Specifically, one or both of the heater 207 and the nozzles 249a, 249b and 249c may be arranged such that a reaction region 249d of each of the plurality of nozzles 249a, 249b and 249c is arranged inside an end portion of the heater 207. According to the present embodiments, the term "reaction region" of each of the plurality of nozzles 249a, 249b and 249c may refer to a region in which various gases are supplied to the substrate (that is, the wafer 200), preferably, a product substrate. In other words, the term "reaction region" of each of the plurality of nozzles 249a, 249b and 249c may refer to a region in which the substrate (that is, the wafer 200) is subjected to various processes in the reaction tube 203. In addition, preferably, the region in which various gases are supplied to the substrate (that is, the wafer 200) may include a portion of each of the nozzles 249a, 249b and 249c in which the gas supply holes 250a, the gas supply holes 250b or the gas supply holes 250c are not provided. As described above, the gases are ejected through the gas supply holes 250a of the nozzles 249a, the gas supply holes 250b of the nozzle 249b and the gas supply holes 250c of the nozzle 249c, respectively. Further, it is preferable that a region of each of the plurality of nozzles 249a, 249b and 249c in which the gas supply holes 250a, the gas supply holes 250b or the gas supply holes 250c are provided may face at least the heater 207. Further, "a temperature of a region is substantially uniform" may refer to, for example, "a temperature difference between a highest temperature location and a lowest temperature location in a region is within 3° C.". By heating the reaction region of the plurality of nozzles 249a, 249b and 249c as described above such that the temperature of the reaction region of each of the plurality of nozzles 249a, 249b and 249c is substantially uniform, it is possible to uniformly perform the fluorine deactivation process in the reaction region of each of the plurality of nozzles 249a, 249b and 249c. Further, it is also possible to supply the plurality of kinds of active species generated in the reaction region 249d of each of the plurality of nozzles 249a, 249b and 249c to a process region of the reaction tube 203 in which at least the wafer 200 is placed. As a result, it is possible to uniformly perform the cleaning process with respect to the process region of the reaction tube 203.

According to the present embodiments, it is preferable that the heater 207 is divided into a plurality of zones along the gas flow direction in the plurality of nozzles 249a, 249b and 249c, and a temperature of each of the plurality of zones can be changed such that a temperature control of each of the plurality of zones can be performed differently (or individually) in (a) and (b) described above. For example, in the reaction tube 203 shown in FIG. 1, it is preferable that the reaction tube 203 is vertically divided into a plurality of zones so that the control structure (that is, the controller 121) can perform the temperature control of the heater 207 for each of the plurality of zones of the reaction tube 203.

For example, in the cleaning process of (a) described above, it is preferable to perform the temperature control so as to provide a temperature gradient such that a temperature of a zone located in an upper portion in the plurality of zones is higher than a temperature of a zone located in a lower portion in the plurality of zones. By providing the temperature gradient described above, even when an amount of the cleaning gas reaching an upper portion of the nozzle or the upper portion of the reaction tube 203 is reduced, it is possible to increase a reactivity of the cleaning gas by elevating the temperature of the zone located in the upper portion in the plurality of zones, and as a result, it is possible to uniformly perform the cleaning process from the upper portion to the lower portion of the nozzle or the reaction tube 203. In addition, when the additive gas is supplied after (a) described above, it is preferable to perform the temperature control such that a temperature gradient similar to that described above can be provided.

In addition, in the fluorine deactivation process of (b) described above, it is possible to perform the temperature control such that temperatures of all the zones are substantially the same. For example, in the fluorine deactivation process of (b) described above, it is possible to perform the temperature control such that temperatures of one or more zones (among the plurality of zones) corresponding to a process region of the wafers 200 are substantially the same. Thereby, it is possible to perform the fluorine deactivation process in the nozzles 249a, 249b and 249c corresponding to the entirety of the zones. In addition, according to the present embodiments, the "temperatures of all the zones are substantially uniform" may refer to, for example, "a temperature difference between a highest temperature zone and a lowest temperature zone in the entirety of the zones is within 3° C.".

On the other hand, as shown in FIG. 1, when the gas flow direction in each of the nozzles 249a, 249b and 249c is a direction from the bottom to the top, in the fluorine deactivation process of (b) described above, it is preferable to perform the temperature control such that a temperature of a lower end zone among the plurality of zones is higher than those of the other zones. As a result, it is possible to heat the gas containing hydrogen and oxygen in advance in the lower end zone (in other words, in an upstream zone among the plurality of zones), and it is possible to shorten a heating time to a suitable reaction temperature in the reaction tube 203.

In addition, by heating each of the first reactive gas and the second reactive gas in advance by the second heater 207a provided downstream of the valve 243d of the gas supply pipe 232d through which the first reactive gas is supplied and the valve 243e of the gas supply pipe 232e through which the second reactive gas is supplied, it is possible to remove the residual fluorine in the gas supply pipe 232a up to the nozzle 249a. Similarly, by heating each of the first reactive gas and the second reactive gas in advance by the second heater 207b provided downstream of the valve 243b of the gas supply pipe 232b through which the first reactive gas is supplied and the valve 243h of the gas supply pipe 232h through which the second reactive gas is supplied, it is possible to remove the residual fluorine in the gas supply pipe 232b up to the nozzle 249b. In addition, by heating each of the first reactive gas and the second reactive gas in advance by the second heater 207c provided downstream of the valve 243k of the gas supply pipe 232k through which the first reactive gas is supplied and the valve 243c of the gas supply pipe 232c through which the second reactive gas is supplied, it is possible to remove the residual fluorine in the gas supply pipe 232c up to the nozzle 249c. In addition, while the present embodiments are described by way of an example in which the first reactive gas and the second reactive gas are heated in separate gas supply pipes, the first reactive gas and the second reactive gas may be heated after being mixed.

According to a method of cleaning the semiconductor device in accordance with (a) and (b) described above, it is possible to perform the cleaning process and the fluorine deactivation process in the reaction tube 203 and the nozzles 249a, 249b and 249c by using the cleaning gas.

(2-4) Next Processing of Substrate (Wafer 200)

After the cleaning process and the fluorine deactivation process in the reaction tube 203 and the nozzles 249a, 249b and 249c are completed by (a) and (b) described above, in (c) described above, the subsequent substrate (that is, the subsequent wafer 200) is transferred (loaded) into the reaction tube 203. With respect to the subsequent substrate (that is, the subsequent wafer 200) loaded into the reaction tube 203, the substrate processing (film-forming process) described in (2-1) above is performed.

Example

Hereinafter, an example of the method of manufacturing the semiconductor device according to the technique of the present disclosure will be described.

In the following descriptions, a notation of a numerical range such as "75° C. to 200° C." means that a lower limit and an upper limit are included in the numerical range. Therefore, for example, the numerical range "75° C. to 200° C." means a range equal to or higher than 75° C. and equal to or lower than 200° C. The same also applies to other numerical ranges described herein.

Outline of Experiment

In the example and a comparative example, first, the film-forming process of forming the film on the wafer 200 is performed several times, and then the cleaning process of (a) described above and the process of supplying the additive gas are alternately and repeatedly performed several times. Then, after performing the fluorine deactivation process of (b) described above, the film-forming process is repeatedly performed again. Then, a thickness of the film is measured for the wafer 200 obtained by each film-forming process.

Film-Forming Process

The following film-forming process described in (2-1) above is performed. A setting process and an initial cleaning process prior to the film-forming process are omitted.

(Source Gas->P/V->First Reactive Gas+Second
Reactive Gas->P/V)×n

First, the wafer 200 is loaded into the reaction tube 203, and then, as the first step, the HCDS gas serving as the source gas is supplied into the reaction tube 203 through the gas supply pipe 232a serving as the first pipe and the nozzle 249a serving as the first nozzle.

Subsequently, as the second step, by vacuum-exhausting the inner atmosphere of the reaction tube 203 while supplying the $N_2$ gas serving as the purge gas through the gas supply pipe 232n via the first pipe and the first nozzle (or without supplying the $N_2$ gas serving as the purge gas), the source gas remaining in the reaction tube 203 is removed from the reaction tube 203.

Then, as the third step, the $O_2$ gas serving as the second reactive gas is supplied to the wafer 200 in the reaction tube 203 through the gas supply pipe 232c serving as the third pipe and the nozzle 249c serving as the third nozzle while supplying the $H_2$ gas serving as the first reactive gas to the wafer 200 in the reaction tube 203 through the gas supply pipe 232b serving as the second pipe and the nozzle 249b serving as the second nozzle.

Finally, as the fourth step, by vacuum-exhausting the inner atmosphere of the reaction tube 203 while simultaneously supplying the purge gas through the gas supply pipe 232o via the second pipe and the second nozzle and the purge gas through the gas supply pipe 232p via the third pipe and the third nozzle, the first reactive gas and the second reactive gas remaining in the process chamber 201 are removed.

The first step through the fourth step described above are repeatedly performed a predetermined number of times. Process conditions in each step are as follows:

A supply flow rate of the source gas: from 0.01 slm to 2 slm, preferably from 0.1 slm to 1 slm;

A supply flow rate of the purge gas: from 0 slm to 10 slm;

A supply flow rate of the first reactive gas: from 0.1 slm to 10 slm;

A supply flow rate of the second reactive gas: from 0.1 slm to 10 slm;

A supply time (time duration) of each gas: from 1 second to 120 seconds, preferably from 1 second to 60 seconds;

A process temperature: from 250° C. to 800° C., preferably from 400° C. to 700° C.; and A process pressure: from 1 Pa to 2,666 Pa, preferably from 67 Pa to 1,333 Pa.

Cleaning Process

After the wafer 200 on which the film-forming process is completed is unloaded, the cleaning process described in (2-2) above is performed by using the entirety of the first nozzle, the second nozzle and the third nozzle. In the example and the comparative example, the following process is performed for each nozzle. Each process is performed in parallel.

First nozzle (that is, the nozzle 249a): process C is performed;

Second nozzle (that is, the nozzle 249b): process A is performed; and

Third nozzle (that is, the nozzle 249c): process B is performed.

That is, the $N_2$ gas serving as the inert gas is continuously supplied through the gas supply pipe 232n via the first pipe and the first nozzle during the cleaning process. Further, the $F_2$ gas serving as the cleaning gas and the NO gas serving as the additive gas are sequentially supplied through the gas supply pipe 232i and the gas supply pipe 232j via the second pipe and the second nozzle in accordance with the process A. Further, the cleaning gas and the additive gas are sequentially supplied through the gas supply pipe 232l and the gas supply pipe 232m via the third pipe and the third nozzle in accordance with the process B. In the example and the comparative example, the process A and the process B are performed simultaneously at each nozzle.

The supply of the cleaning gas and the supply of the additive gas are repeatedly performed a predetermined number of times. Process conditions in the cleaning process are as follows:

A supply flow rate of the cleaning gas: from 1 slm to 20 slm, preferably from 5 slm to 15 slm;

A supply flow rate of the additive gas: from 0.1 slm to 2 slm, preferably from 0.5 slm to 1.5 slm;

A supply time (time duration) of each gas: from 10 seconds to 120 seconds, preferably from 20 seconds to 40 seconds;

A process temperature: from 250° C. to 400° C., preferably from 250° C. to 350° C.; and A process pressure: from 1 Torr to 1,000 Torr, preferably from 10 Torr to 500 Torr.

Fluorine Deactivation Process

After the cleaning process, the fluorine deactivation process described in (2-3) above is performed by using the entirety of the first nozzle, the second nozzle and the third nozzle.

First, the $H_2$ gas serving as the first reactive gas flowing through the gas supply pipe 232d and the $O_2$ gas serving as the second reactive gas flowing through the gas supply pipe 232e are both supplied into the reaction tube 230 via the first pipe and the first nozzle. Simultaneously, the first reactive gas flowing through the gas supply pipe 232b and the second reactive gas flowing through the gas supply pipe 232h are both supplied into the reaction tube 203 via the second pipe and the second nozzle. Further, simultaneously, the first reactive gas flowing through the gas supply pipe 232k and the second reactive gas flowing through the gas supply pipe 232c are both supplied into the reaction tube 203 via the third pipe and the third nozzle. A ratio of a supply flow rate of the first reactive gas to a supply flow rate of the second reactive gas is approximately set to 1:1. Other process conditions are as follows:

A supply flow rate of the first reactive gas: from 1 slm to 10 slm;

A supply flow rate of the second reactive gas: from 1 slm to 10 slm;

A supply time (time duration) of each gas: from 30 minutes to 300 minutes, preferably from 100 minutes to 150 minutes;

A process temperature: from 600° C. to 800° C.; and

A process pressure: from 5 Pa to 133 Pa, preferably from 5 Pa to 30 Pa.

Further, in the comparative example, neither the first reactive gas nor the second reactive gas is supplied through the first pipe and the first nozzle, the first reactive gas flowing though the gas supply pipe 232b alone is supplied through the second pipe and the second nozzle, and the second reactive gas flowing though the gas supply pipe 232c alone is supplied through the third pipe and the third nozzle.

Results

Figure 4:
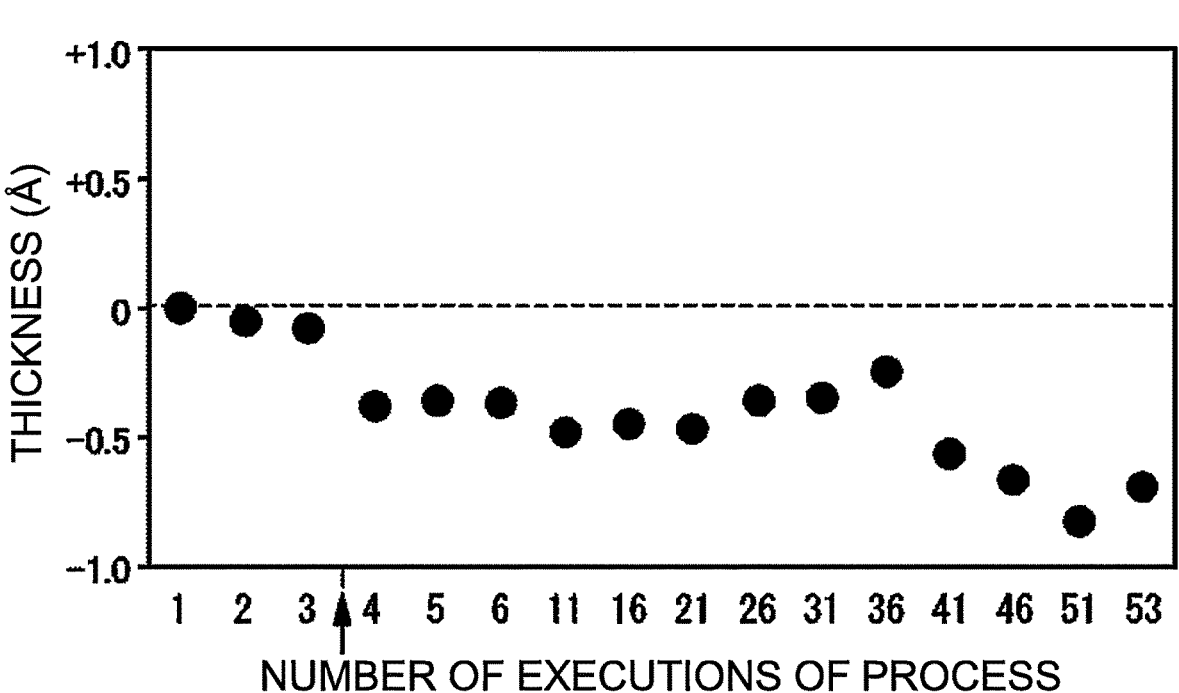
FIG. 4 is a graph schematically illustrating results of a film-forming stability according to a comparative example.
Figure 5:
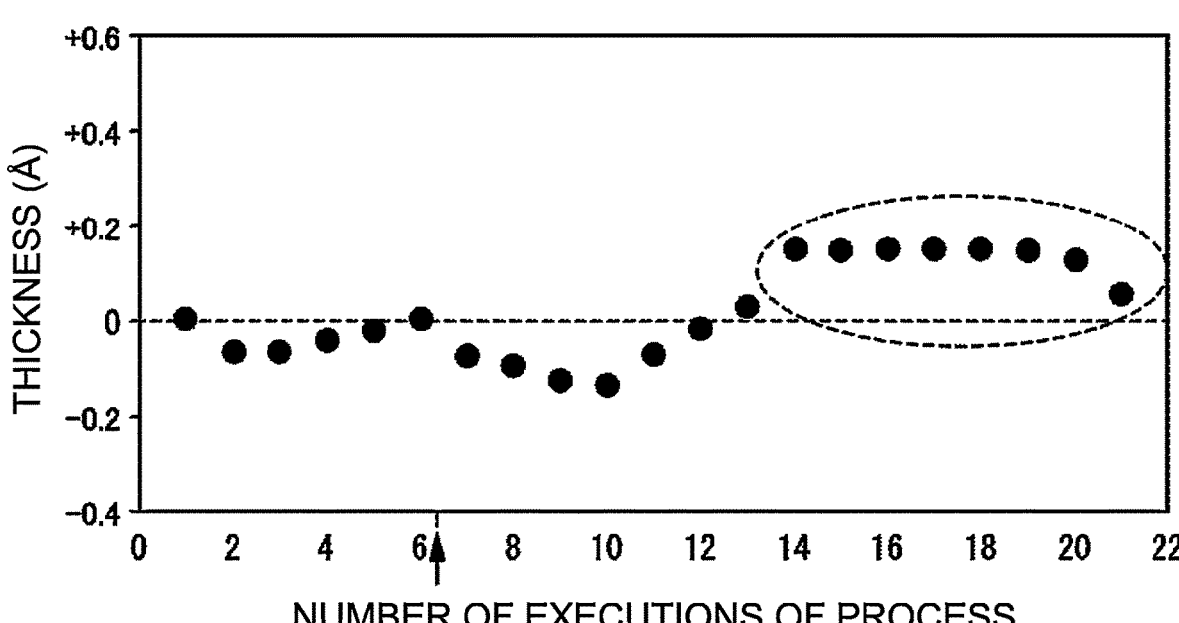
FIG. 5 is a graph schematically illustrating results of the film-forming stability according to an example of the embodiments of the present disclosure.

Results of the film-forming stability in the comparative example and the example are schematically illustrated in FIGS. 4 and 5, respectively. In FIGS. 4 and 5, a vertical axis of a graph represents a thickness of the film of the wafer 200 (an increase/decrease with respect to a reference thickness of the film is represented by a unit of angstrom (Å)), and a horizontal axis of the graph represents the number of executions of the film-forming process. In addition, in each of FIGS. 4 and 5, a broken line represents the reference thickness of the film. Further, in each of FIGS. 4 and 5, a timing at which the cleaning process and the fluorine deactivation process are performed is indicated by an arrow.

According to the comparative example, when the cleaning process and the fluorine deactivation process are performed after a third execution of the film-forming process, the thickness of the film is reduced by about 0.5 from the reference thickness of the film immediately after the cleaning process and the fluorine deactivation process. In particular, the decrease in the thickness of the film became more remarkable after a forty-first execution of the film-forming process.

On the other hand, according to the example, when the cleaning process and the fluorine deactivation process are performed after a sixth execution of the film-forming process, the thickness of the film is reduced immediately after the cleaning process and the fluorine deactivation process. However, an amount of decrease is less than 0.1. Further, the thickness of the film is stabilized after reaching a fourteenth execution of the film-forming process.

Figures 6, 7:
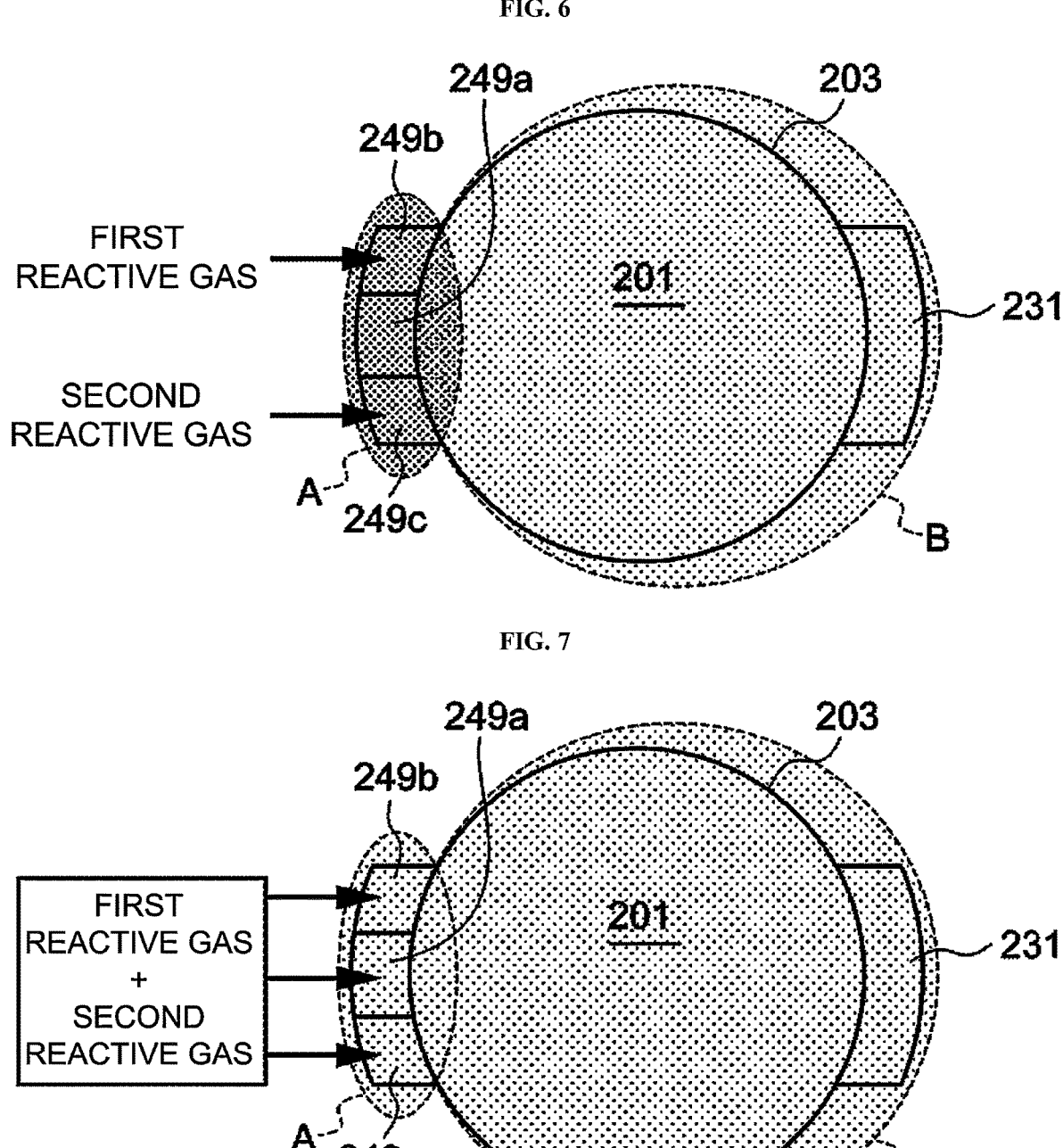
FIG. 6 is a diagram schematically illustrating a deactivation of a residual fluorine according to the comparative example.
FIG. 7 is a diagram schematically illustrating the deactivation of the residual fluorine according to the example of the embodiments of the present disclosure.

In the comparative example, as shown in a schematic diagram of FIG. 6, the first reactive gas alone is supplied through the nozzle 249b (that is, the second nozzle), the second reactive gas alone is supplied through the nozzle 249c (that is, the third nozzle), and neither the first reactive gas nor the second reactive gas is supplied through the nozzle 249a (that is, the first nozzle). As a result, in a region, denoted by "B" in FIG. 6, in which the process chamber 201 in the reaction tube 203 and the exhaust pipe 231 are disposed, the first reactive gas and the second reactive gas are sufficiently mixed such that the fluorine deactivation process can be sufficiently performed. However, in a region near the nozzles 249a, 249b and 249c denoted by "A" in FIG. 6, the first reactive gas and the second reactive gas are not sufficiently mixed such that the fluorine deactivation process is not sufficiently performed. It is considered that the fluorine deactivation process which is not sufficiently performed may adversely affect the film-forming process.

On the other hand, in the example, as shown in a schematic diagram of FIG. 7, the first reactive gas and the second reactive gas are both supplied through the entirety of the nozzle 249a (that is, the first nozzle), the nozzle 249b (that is, the second nozzle) and the nozzle 249c (that is, the third nozzle). As a result, since the first reactive gas and the second reactive gas are sufficiently mixed not only in the region denoted by "B" in the FIG. 7 but also in the region denoted by "A" in the FIG. 7, the fluorine deactivation process is sufficiently performed. It is considered that the subsequent film-forming process after the cleaning process and the fluorine deactivation process can be performed well.

OTHER EMBODIMENTS

While the technique of the present disclosure is described in detail by way of the embodiments described above, the technique of the present disclosure is not limited thereto.

The embodiments described above may be modified in various ways without departing from the scope thereof.

For example, in the film-forming process, a film may be formed on the wafer 200 by one of gas supply sequences shown below. The cleaning process described above may also be preferably applied to the nozzles and the reaction tube on which the film containing materials shown below are formed.

(Silicon-containing Source Gas->Carbon-containing Gas->Nitriding Gas->Oxidizing Gas(Second Reactive Gas))×$n$=>SiOCN (Silicon-containing Source Gas->Oxidizing Gas(Second Reactive Gas)->Nitriding Gas)×$n$=>SiON (Silicon-containing Source Gas->Nitriding Gas->Oxidizing Gas(Second Reactive Gas))× $n$=>SiON (Silicon-containing Source Gas->Nitriding Gas)× $n$=>SiN In the gas supply sequences described above, for example, propylene gas ($C_3H_6$ gas) may be used as the carbon-containing gas, and ammonia gas ($NH_3$ gas) may be used as the nitriding gas.

For example, recipes used in each process described above are preferably prepared individually according to process contents and stored in the memory 121c via an electric communication line or the external memory 123. When starting each process described above, the CPU 121a is preferably configured to select an appropriate recipe among the recipes stored in the memory 121c according to the process contents. Thus, various films of different composition ratios, qualities and thicknesses may be formed in a reproducible manner by using a single substrate processing apparatus. In addition, since the burden on an operator of the substrate processing apparatus may be reduced, various processes may be performed quickly while preventing a malfunction of the substrate processing apparatus.

The above-described recipe is not limited to creating a new recipe. For example, the recipe may be prepared by changing an existing recipe stored in the substrate processing apparatus in advance. When changing the existing recipe to a new recipe, the new recipe may be installed in the substrate processing apparatus via the electric communication line or the recording medium in which the new recipe is stored. In addition, the existing recipe already stored in the substrate processing apparatus may be directly changed to the new recipe by operating the input/output device 122 of the substrate processing apparatus.

For example, the above-described embodiments are described in detail by way of an example in which the $F_2$ gas or the $NF_3$ gas is used as the fluorine-containing gas (that is, the cleaning gas). However, the technique of the present disclosures is not limited thereto. For example, a gas such as hydrogen fluoride (HF) gas, carbon tetrafluoride ($CF_4$) gas and chlorine trifluoride ($ClF_3$) may be used as the fluorine-containing gas (that is, the cleaning gas). In addition, preferably, the cleaning gas may contain at least one of the $F_2$ gas, the $NF_3$ gas, the HF gas, the $CF_4$ gas or the $ClF_3$ gas.

For example, the above-described embodiments are described in detail by way of an example in which the fluorine-containing gas is used as the cleaning gas. However, the technique of the present disclosures is not limited thereto. For example, the technique of the present disclosures may also be applied when a cleaning gas containing a halogen element is used. For example, the halogen element refers to an element such as chlorine (Cl), fluorine (F), bromine (Br) and iodine (I).

For example, the above-described embodiments are described by way of an example in which a batch type substrate processing apparatus configured to simultaneously process a plurality of substrates is used to form the film. However, the technique of the present disclosure is not limited thereto. For example, the technique of the present disclosure may be preferably applied when a single wafer type substrate processing apparatus configured to simultaneously process one or several substrates is used to form the film. For example, the above-described embodiments are described by way of an example in which a substrate processing apparatus including a hot wall type process furnace is used to form the film. However, the technique of the present disclosure is not limited thereto. For example, the technique of the present disclosure may be preferably applied when a substrate processing apparatus including a cold wall type process furnace is used to form the film.

Even when such substrate processing apparatuses are used, the process sequence and the process conditions of each process may be substantially the same as those of the embodiments described above. Even in such a case, the same effects according to the embodiments described above may also be obtained similarly.

The embodiments described above may be appropriately combined. In addition, the process sequence and the process conditions of each combination thereof may be substantially the same as those of the embodiments described above.

According to some embodiments of the present disclosure, it is possible to reduce the thickness fluctuation of the film in the film-forming process by effectively removing the residual element after the cleaning process.

What is claimed is:
1. A cleaning method comprising:
(a) performing a first cycle comprising:
(a1) supplying a source gas to a substrate located inside a chamber through a hole provided in a first nozzle; and
(a2) supplying a reactive gas to the substrate through a hole provided in a second nozzle;
(b) after (a), unloading the substrate from the chamber;
(c) after (b), cleaning an inside of the chamber so that an accumulated film in the chamber is removed, wherein (c) comprises:
(c1) supplying a cleaning gas containing fluorine into the chamber through a plurality of nozzles in the chamber, wherein the plurality of nozzles comprises at least the first nozzle and the second nozzle, each of the plurality of nozzles including a plurality of holes through which the cleaning gas is supplied into the chamber; and
(c2) supplying a gas containing nitrogen and oxygen into the chamber through at least one hole provided in each of the plurality of nozzles;
(d) after (c), supplying a mixed gas of a hydrogen gas and an oxygen gas into the chamber through the plurality of holes of each of the plurality of nozzles;
(e) after (d), loading a subsequent substrate into the chamber; and
(f) after (e), performing a second cycle comprising:
f1) supplying the source gas to the subsequent substrate in the chamber through the hole provided in the first nozzle; and

(f2) supplying the reactive gas to the subsequent substrate through the hole provided in the second nozzle,
wherein a temperature in the chamber in (d) is higher than a temperature in the chamber in (c).
2. The cleaning method of claim 1, wherein, in (c), (c1) and (c2) are alternately performed.
3. The cleaning method of claim 1, further comprising:
(g) heating the first nozzle by a heater in (d) such that the mixed gas is activated in the first nozzle.
4. The cleaning method of claim 1, further comprising:
heating the mixed gas of the hydrogen gas and the oxygen gas by a heater provided outside the chamber.
5. A method of manufacturing a semiconductor device comprising:
the cleaning method of claim 1,
wherein, in (f), the semiconductor device is manufactured on the subsequent substrate.
6. The cleaning method of claim 1, wherein, in (c1), the cleaning gas is at least partially simultaneously supplied through the plurality of nozzles into the chamber.
7. The cleaning method of claim 1, wherein, in (d), supplies of the mixed gas through the plurality of nozzles are simultaneously performed.
8. The cleaning method of claim 3, wherein, in (g), the first nozzle is heated such that a temperature of a reaction region of the first nozzle is uniform.
9. The cleaning method of claim 3, wherein, in (g), the first nozzle is heated by the heater arranged at a location corresponding to a region in which the substrate is located in the chamber.
10. The cleaning method of claim 3, wherein at least one of the heater or the first nozzle is arranged such that at least a region of the first nozzle in which the plurality of holes of the first nozzle are provided faces the heater.
11. The cleaning method of claim 3, wherein the heater is divided into a plurality of zones along a flow direction of the source gas in the first nozzle, and further comprising:
(h) changing a temperature of each of the plurality of zones such that a temperature control for each of the plurality of zones is different between in (c) and in (d).
12. The cleaning method of claim 6, wherein, in (c1), supplies of the cleaning gas through the plurality of nozzles are simultaneously terminated.
13. The cleaning method of claim 6, wherein, in (c1), supplies of the cleaning gas through the plurality of nozzles are simultaneously started.
14. The cleaning method of claim 11, wherein, in (d), the temperature control is performed such that temperatures of one or more zones, among the plurality of zones, corresponding to at least a process region of the substrate are substantially the same.
15. The cleaning method of claim 11, wherein, in (d), the temperature control is performed such that a temperature of a lower end zone among the plurality of zones is controlled to be higher than those of the other zones among the plurality of zones.
16. A non-transitory computer-readable recording medium storing a program that causes, by a computer, a substrate processing apparatus to perform:
(a) performing a first cycle comprising:
(a1) supplying a source gas to a substrate in a chamber through a hole provided in a first nozzle; and
(a2) supplying a reactive gas to the substrate through a hole provided in a second nozzle;

(b) after (a), unloading the substrate from the chamber;

(c) after (b), cleaning an inside of a chamber after (a) so that an accumulated film in the chamber is removed, wherein (c) comprises:

(c1) supplying a cleaning gas containing fluorine into the chamber through a plurality of nozzles in the chamber, wherein the plurality of nozzles comprises at least the first nozzle and the second nozzle, each of the plurality of nozzles including a plurality of holes through which the cleaning gas is supplied into the chamber; and (c2) supplying a gas containing nitrogen and oxygen into the chamber through at least one hole provided in each of the plurality of nozzles;

(d) after (c), supplying a mixed gas of a hydrogen gas and an oxygen gas into the chamber through the plurality of holes provided in each of the plurality of nozzles;

(e) after (d), loading a subsequent substrate into the chamber; and (f) after (e), performing a second cycle comprising:

(f1) supplying the source gas to the subsequent substrate in the chamber through the hole provided in the first nozzle; and (f2) supplying the reactive gas to the subsequent substrate through the hole provided in the second nozzle, wherein a temperature in the chamber in (d) is higher than a temperature in the chamber in (c).

\*  \*  \*  \*  \*